United States Patent [19]
Lake

[11] Patent Number: 6,083,773
[45] Date of Patent: *Jul. 4, 2000

[54] METHODS OF FORMING FLIP CHIP BUMPS AND RELATED FLIP CHIP BUMP CONSTRUCTIONS

[75] Inventor: Rickie C. Lake, Eagle, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/931,814

[22] Filed: Sep. 16, 1997

[51] Int. Cl.[7] .......................... H01L 21/44; H01L 21/48; H01L 21/50

[52] U.S. Cl. .................. 438/108; 438/106; 438/107; 438/613

[58] Field of Search ................................. 438/108, 106, 438/107, 613

[56] References Cited

U.S. PATENT DOCUMENTS

| | | | |
|---|---|---|---|
| 2,934,685 | 4/1960 | Jones | 257/738 |
| 4,600,600 | 7/1986 | Pammer et al. | 427/89 |
| 5,022,580 | 6/1991 | Pedder | 438/108 |
| 5,541,135 | 7/1996 | Pfeifer et al. | 438/108 |
| 5,760,469 | 6/1998 | Higashiguchi et al. | 438/106 |
| 5,796,591 | 8/1998 | Dalal et al. | 361/779 |
| 5,828,128 | 10/1998 | Higashiguchi et al. | 257/738 |

OTHER PUBLICATIONS

Ken Gilleo, "Flip or Flop?", Technical Articles of Alpha Metals, Inc., Dec. 1996.
Ken Gilleo et al., "Flip Chip 1, 2, 3: Bump, Bond, Fill", Alpha Metals, Inc., Jul. 1996.
"Encapsulated Solder Joint for Chip Mounting"; IBM Technical Disclosure Bulletin, vol. 32, No. 10B, Mar. 1990; 1 page.

*Primary Examiner*—Kevin M. Picardat
*Assistant Examiner*—D. Mark Collins
*Attorney, Agent, or Firm*—Wells, St. John, Roberts, Gregory & Matkin P.S.

[57] ABSTRACT

Methods of forming flip chip bumps and related flip chip bump constructions are described. In one implementation, a bump of conductive material is formed over a substrate. At least a portion of the bump is dipped into a volume of conductive flowable material, with some of the flowable material remaining over the bump. The remaining flowable material over the bump is solidified and includes an outermost surface the entirety of which is outwardly exposed. In another implementation, the outermost surface include an uppermost generally planar surface away from the substrate. The solidified flowable material together with the conductive material of the bump provide a bump assembly having a height which is greater than the height of the original bump. The increased height is achieved without meaningfully increasing a width dimension of the bump proximate the substrate.

47 Claims, 6 Drawing Sheets

METHODS OF FORMING FLIP CHIP BUMPS AND RELATED FLIP CHIP BUMP CONSTRUCTIONS

TECHNICAL FIELD

This application pertains to methods of forming flip chip bumps and to related flip chip bump constructions.

BACKGROUND OF THE INVENTION

One method of integrated circuit interconnection is called flip chip bonding. Here, bumps of solder or other conductive material are deposited onto conductive pads of a semiconductor wafer or chip. After separation of individual dies from the wafer, the individual dies or chips are turned upside down, and the bumps are properly aligned with a metallization pattern on another substrate. The aligned bumps are then joined to appropriate points on the pattern.

This invention arose out of concerns associated with improving flip chip bump constructions and formation techniques. This invention also arose out of concerns associated with improving circuit interconnections which utilize flip chip bumps and the methods through which such interconnections are formed.

SUMMARY OF THE INVENTION

Methods of forming flip chip bumps and related flip chip bump constructions are described. In one implementation, a bump of conductive material is formed over a substrate. At least a portion of the bump is dipped into a volume of conductive flowable material, with some of the flowable material remaining over the bump. The remaining flowable material over the bump is solidified and includes an outermost surface the entirety of which is outwardly exposed. In another implementation, the outermost surface include an uppermost generally planar surface away from the substrate. The solidified flowable material together with the conductive material of the bump provide a bump assembly having a height which is greater than the height of the original bump. The increased height is achieved without meaningfully increasing a width dimension of the bump proximate the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
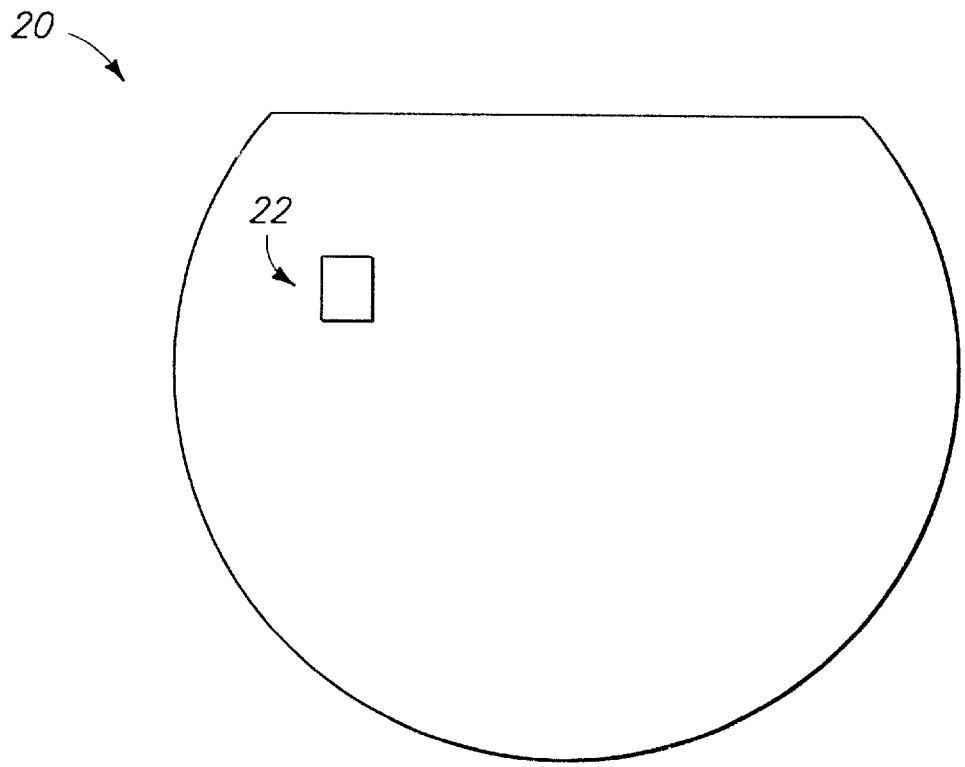
FIG. 1 is a top plan view of a semiconductor wafer.
Figure 2:
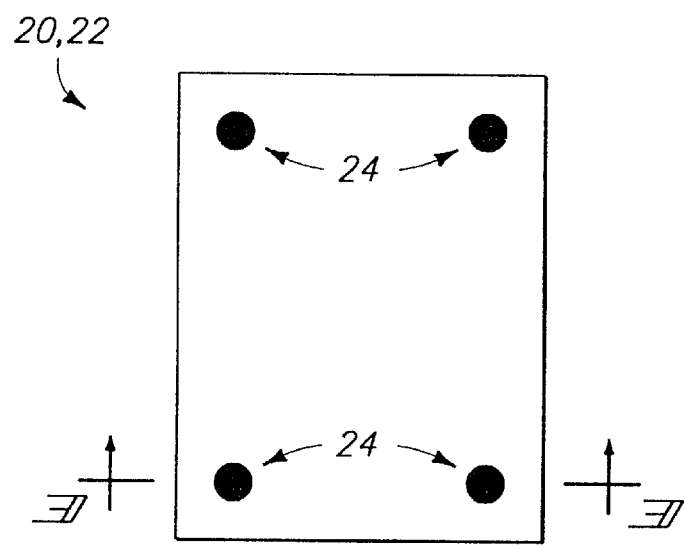
FIG. 2 is a view of an individual die which comprises part of the FIG. 1 wafer.
Figure 3:
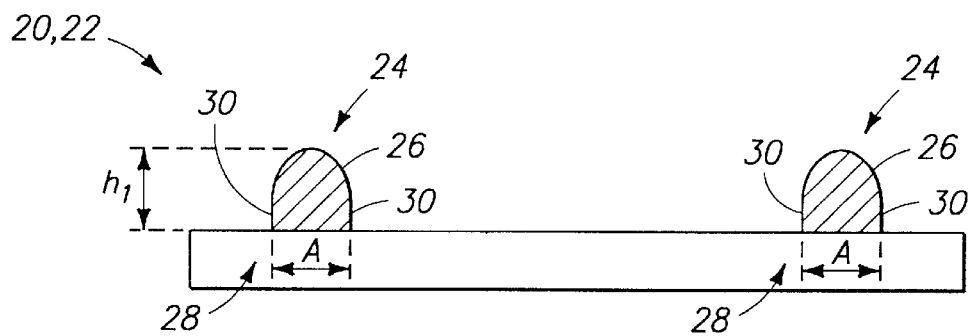
FIG. 3 is a view taken along line 3—3 in FIG. 2.

Referring to FIGS. 1–3, a semiconductor wafer or substrate in process is shown generally at 20. Substrate 20 has been fabricated into discrete die or die areas. An exemplary die or die area is shown at 22. The die areas have integrated circuitry fabricated therewithin and will be singulated into individual die constituting flip chips.

A plurality of bumps 24 of conductive material are formed over substrate 20. For purposes of the ongoing discussion, substrate 20 and/or individual die 22 are considered as a first substrate. The illustrated bumps 24 constitute a portion of a series of bumps which are formed over substrate 20 and make desired contact with bond pads which are not specifically shown. The bond pads enable electrical connections to be made between the resultant chip and circuitry or components external of the chip. Individual bumps of the series have an outer surface 26 which defines a height $h_1$ over the substrate. Individual bump heights can vary between the bumps as will become apparent below. Additionally, bumps can come in a range of heights. An exemplary range can be between about 1.5 to 4.5 mils. Other range values are possible. Bumps 26 also include base portions 28 which are disposed over substrate 22. The base portions define respective first surface areas A which engage substrate 22. First surface areas A define respective width dimensions of each bump which lie in directions in the plane of the page upon which FIG. 3 appears. Typical width dimensions are between about 8–10 mils. Other width dimensions are possible such as width dimensions between about 4–5 mils. The width dimensions are bounded by the outer surface of base portions 28 designated at 30 proximate substrate 22.

Figure 4:
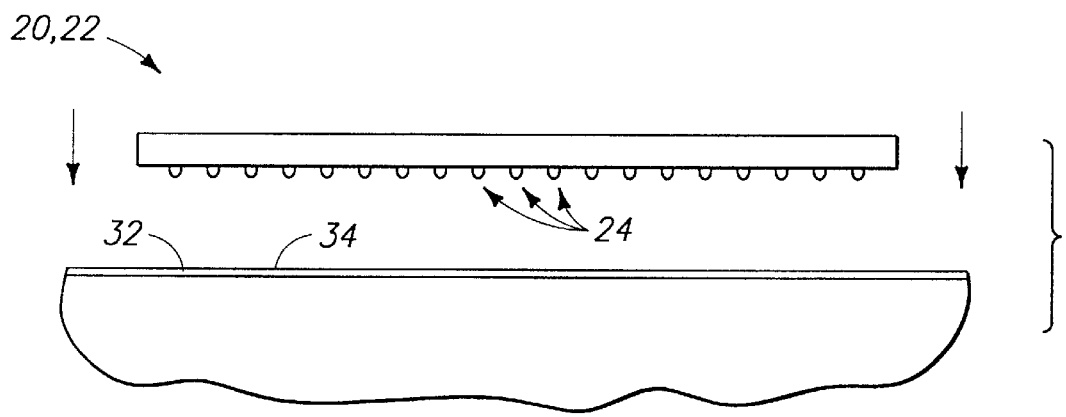
FIG. 4 is a view of the FIG. 1 wafer undergoing processing in accordance with one implementation of the invention.
Figure 5:
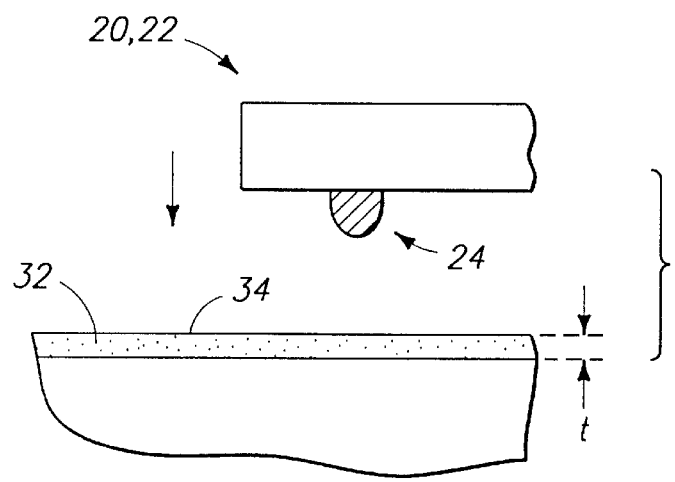
FIG. 5 is a fragmentary portion of the FIG. 4 wafer.

Referring to FIGS. 4 and 5, a volume of conductive flowable material 32 is provided over a surface 34 to a desired thickness t. Substrate 20 is shown in an inverted position with bumps 24 facing flowable material 32. An exemplary thickness t is between about two-thirds to three-fourths of bump heights $h_1$. In the illustrated example, flowable material 32 comprises a conductive epoxy which is drawn down over surface 34; and surface 34 constitutes a generally smooth planar surface such as glass or machined and polished metal.

Figure 6:
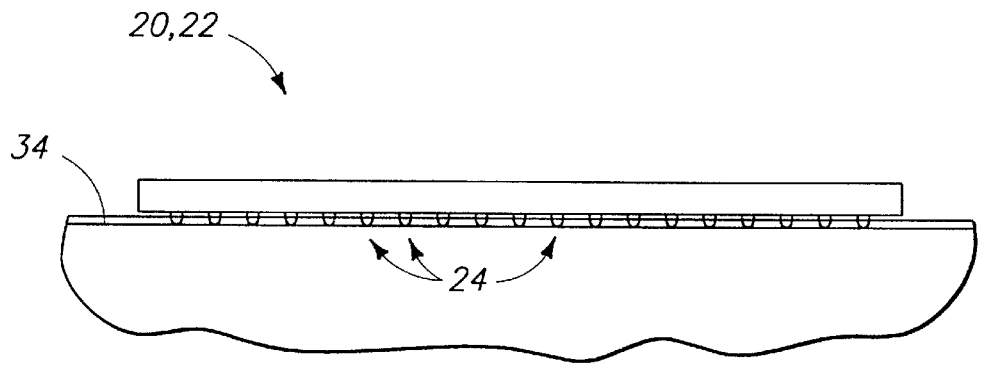
FIG. 6 is a view of the FIG. 1 wafer at a processing step which is different from the one shown in FIG. 4.
Figure 7:
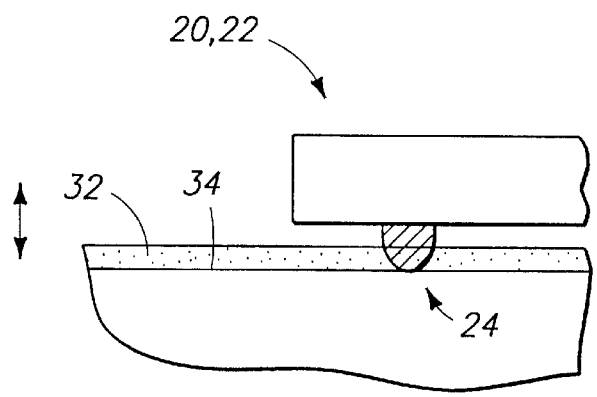
FIG. 7 is a fragmentary portion of the FIG. 6 wafer.

Referring to FIGS. 6 and 7, substrate 20 and surface 34 are moved toward one another sufficiently to immerse at least a portion of bumps 24 in conductive material 32. The bumps are extended into material 32 a distance which is less than the individual bump heights. In some instances, such distance is sufficient to engage a bump with surface 34. In other instances, where the bumps do not have standardized heights, some of the bumps will not be engaged with surface 34.

Figure 8:
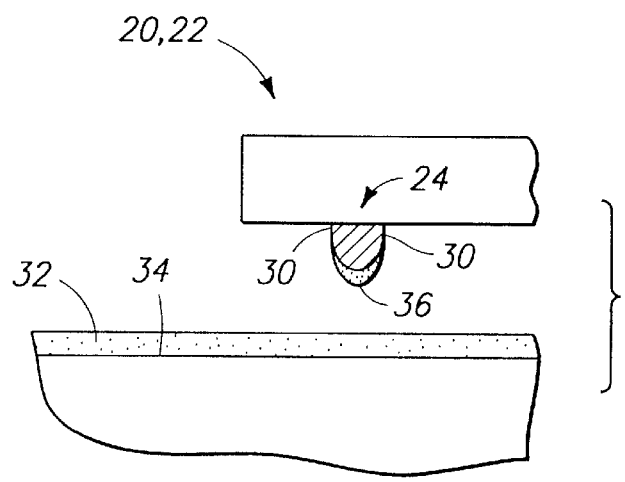
FIG. 8 is a view of the FIG. 7 wafer portion at a different processing step.

Referring to FIG. 8, substrate 20 and material 32 or surface 34 are separated from one another and bumps 24 are removed from material 32. For purposes of the ongoing discussion, the immersing and removing of the bumps into material 34 constitutes dipping the bumps into the flowable material. When the bumps are removed from material 32, at least some flowable material 36 remains over bumps 24 typically in a generally flowable state. In the illustrated example, remaining material 36 is not disposed over base portion outer surface 30. Subsequently, the bumps are exposed to conditions which are effective to at least partially solidify flowable material 36 over the bump. As used in the context of this document, the term "solidify" will be understood to mean imparting a relative firmness to the flowable material. In the illustrated example, material 36 is solidified into a generally non-flowable state. Where material 36 constitutes conductive epoxy, such would be sufficiently cured into the non-flowable state.

Figure 9:
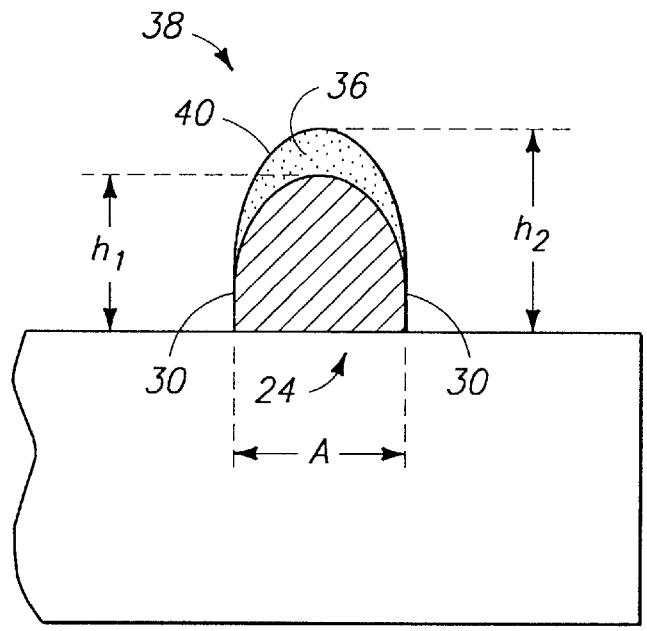
FIG. 9 is an enlarged view of the FIG. 8 wafer portion.
Figure 15:
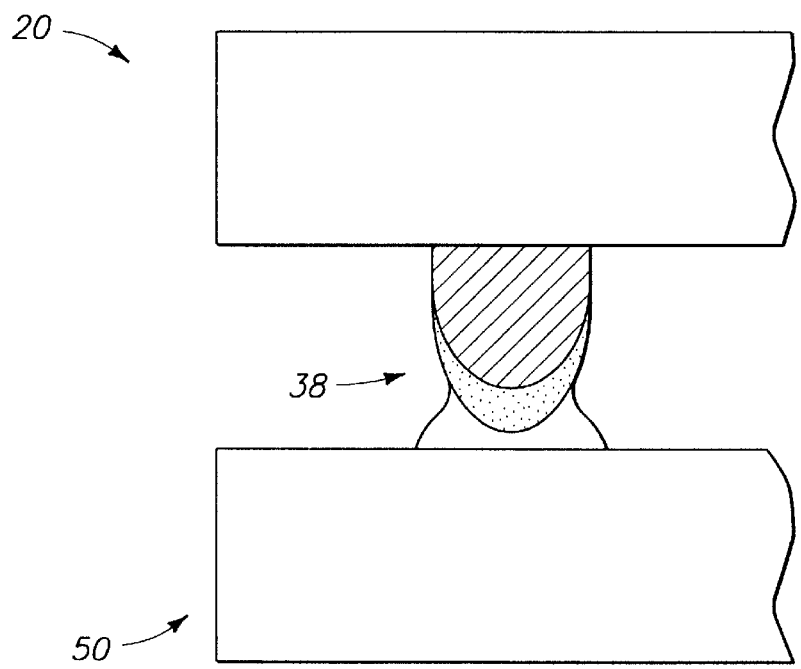
FIG. 15 is a view of a pair of substrates which have been bonded together.

Referring to FIG. 9, solidified material 36 together with original bump 24 provide a bump assembly 38 having a height $h_2$ which is greater than $h_1$. Exemplary heights $h_2$ are greater than or equal to about 5 mils. Bump assembly 38 includes an outermost surface 40 the entirety of which is outwardly exposed. In the illustrated example, bump assembly outermost surface 40 comprises base portion outer surface 30. Accordingly, the addition of solidified material 36 increases the effective bump height without significantly increasing the width dimension. After material 36 is solidified, substrate 20 can be singulated into individual die which can then be bonded with a second substrate 50 (FIG. 15).

Figure 10:
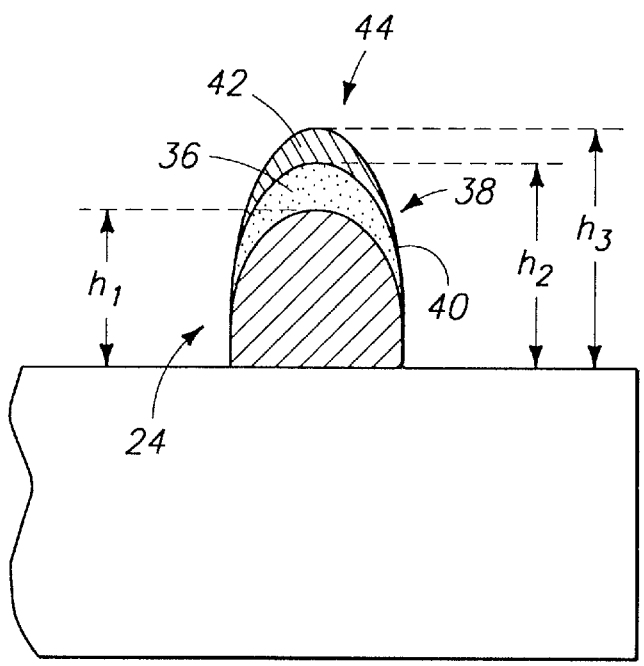
FIG. 10 is a view of the FIG. 9 wafer portion which has been processed in accordance with an alternate embodiment.

Referring to FIG. 10 and in accordance with one aspect of the invention, after material 36 is solidified to provide bump assembly 38, outermost surface 40 can be dipped into a volume of material such as material 32, substantially as described above. Accordingly, at least some flowable material 42 remains over outermost surface 40. Remaining material 42 can be solidified substantially as described above. Alternately, remaining material 42 can be maintained in a generally flowable state and subsequently bonded with a second substrate as in FIG. 15. If material 42 is solidified, such would provide a composite bump assembly 44 having an increased height $h_3$ which is greater than both $h_1$ and $h_2$. Similarly, the addition of solidified material 42 can increase the effective bump height without significantly increasing the width dimension. The process can be repeated as desired.

Figure 11:
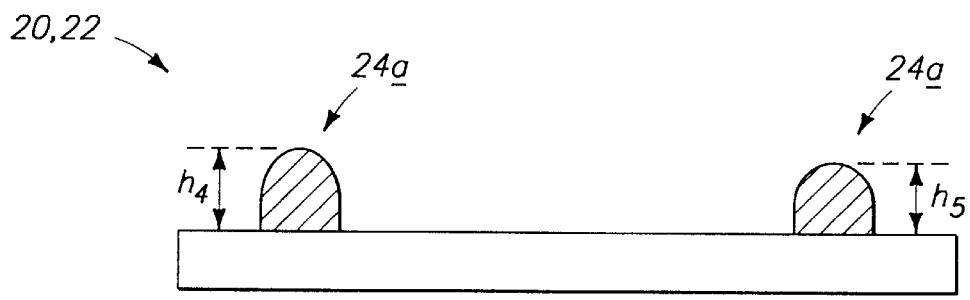
FIG. 11 is a view of a wafer portion having a pair of flip chip bumps which are to be processed in accordance with an alternate implementation of the invention.

Referring to FIG. 11, an alternate embodiment is described with like numerals from the above described embodiment being utilized where appropriate, with differences being indicated by the suffix "a" or with different numerals or letters. Accordingly, bumps 24a are provided over substrate 22. The bumps can have the same or different heights such as $h_4$, $h_5$.

Figure 12:
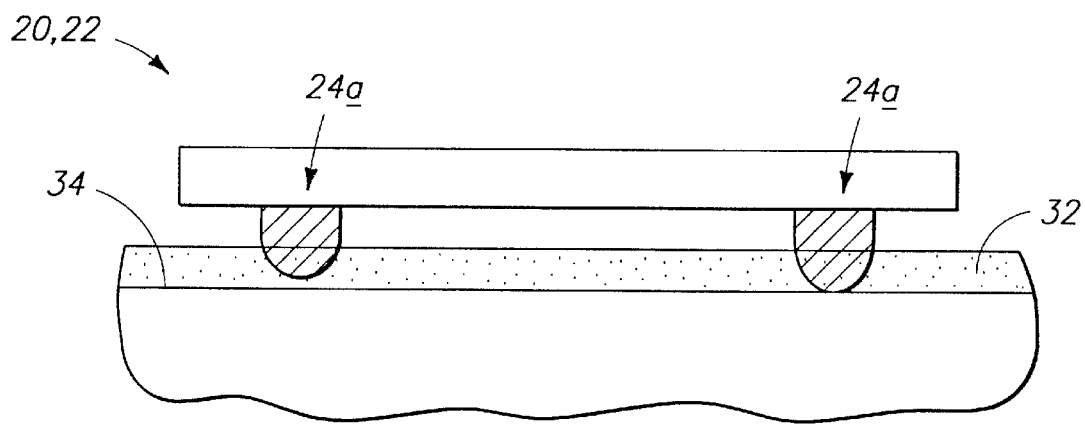
FIG. 12 is a view of the FIG. 11 wafer portion at one processing step.

Referring to FIG. 12, bumps 24a are immersed in flowable material 32. The rightmost bump 24a has a height which is sufficient to bring it into engagement with surface 34. The leftmost bump, however, is not sufficient in height to engage surface 34. Substrate 22 and material 34 are subsequently separated from one another with some conductive material 36a (FIG. 13) remaining over the individual bumps as described above.

Figure 13:
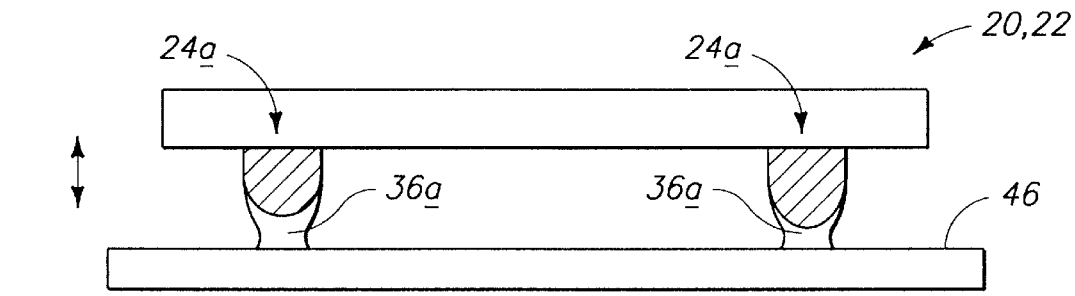
FIG. 13 is a view of the FIG. 11 wafer portion at a different processing step.

Referring to FIG. 13, and while remaining material 36a is in a generally flowable state, such is engaged with and solidified or cured against a generally planar surface 46. Such renders material 36a into a generally non-flowable or solidified state. After material 36a is solidified, substrate 22 and surface 46 are separated from one another.

Figure 14:
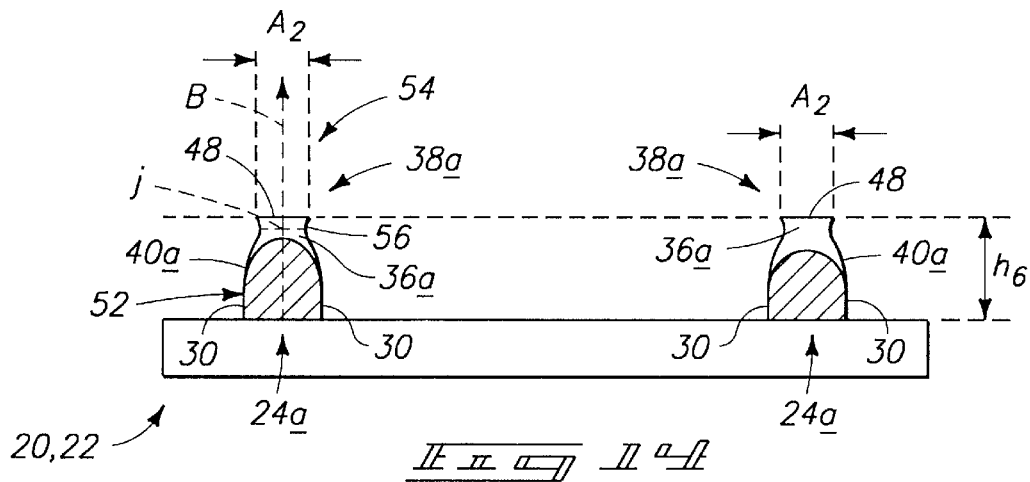
FIG. 14 is a view of the FIG. 11 wafer portion at a different processing step.

Referring to FIG. 14, respective bump assemblies 38a are provided. Each bump assembly 38a includes an outermost surface 40a, a portion of which defines a generally planar uppermost surface 48 away from substrate 22. Uppermost surfaces 48 define respective second surface areas $A_2$. The magnitudes of the first and second surface areas can be different from one another, e.g., second surface areas $A_2$ can be less in magnitude than first surface areas A (FIG. 3). In the illustrated example, the first and second surface areas define planes which are generally parallel with one another.

Processing bumps 24a in accordance with this aspect of the invention provides bump assemblies 38a which are essentially uniform in height relative to the substrate over which each is formed.

Alternately considered and with reference to the leftmost bump assembly 38a, a main body portion 52 is disposed over substrate 22 and extends away therefrom along a central axis B. A top portion 54 is joined with main body portion 52 proximate a joinder region j, indicated by a dashed line intermediate uppermost surface 48 and substrate 22. A side surface 56 is joined with uppermost surface 48 and extends away therefrom and toward central axis B. In the illustrated example, main body portion 52 tapers along central axis B away from substrate 22; and top portion 54 approximates a frustum.

The above-described methodologies provide flip chip bumps having greater heights without meaningfully increasing, if at all, the width dimensions thereof. This allows desirable spacing to be maintained between bonded substrates and reduces the likelihood that the epoxy to which the bump is bonded on another substrate undesirably contacts the substrate from which the bumps project.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a flip chip bump comprising:

forming a bump comprising conductive material over a substrate;

with the entire bump being outwardly exposed, dipping at least a portion of the exposed bump into a volume of conductive flowable material, at least some of the conductive flowable material remaining over the bump; and solidifying the conductive flowable material remaining over the bump, the solidified conductive material having an outermost surface the entirety of which is outwardly exposed.

2. The method of claim 1 further comprising after solidifying the flowable material, dipping at least a portion of the outermost surface into a volume of conductive flowable material, at least some of said flowable material remaining over the outermost surface.

3. The method of claim 2 further comprising after dipping the outermost surface portion into the conductive flowable material, solidifying said flowable material remaining over the outermost surface, said solidified flowable material remaining over the outermost itself having an outermost surface the entirety of which is outwardly exposed.

4. The method of claim 1, wherein:
the bump defines a bump height over the substrate;
the volume of conductive flowable material is provided over a surface and to a desired thickness relative thereto; and
the dipping of the bump portion comprises dipping said portion into the conductive flowable material a distance which is less than the bump height.

5. The method of claim 4, wherein said distance is sufficient to engage the bump with the surface over which the conductive flowable material is provided.

6. The method of claim 4, wherein said distance is about two-thirds to three-fourths of the bump height.

7. The method of claim 1, wherein:
the bump comprises a base portion having an outer surface proximate the substrate, the base portion outer surface defining a width dimension; and
the flowable material remaining over the bump is not disposed over the base portion outer surface.

8. A method of forming a flip chip bump comprising:
forming a bump comprising conductive material over a substrate;
dipping at least a portion of the bump into a conductive flowable material, at least some of the flowable material remaining over the bump; and
exposing the bump to conditions effective to solidify the flowable material over the bump, the solidified conductive material having an outermost surface the entirety of which is outwardly exposed, at least a portion of the outermost surface defining a generally planar uppermost surface away from the substrate.

9. The method of claim 8, wherein the exposing comprises:
engaging the flowable material remaining over the bump with a generally planar surface; and
the exposing comprising at least partially solidifying said flowable material during said engaging.

10. The method of claim 9, wherein the flowable material comprises a curable material and said solidifying comprises curing said material.

11. The method of claim 8, wherein:
the bump defines a first surface area which engages the substrate; and
the generally planar uppermost surface defines a second surface area, the first and second surface areas being different in magnitude.

12. The method of claim 11, wherein the magnitude of the second surface area is less than the magnitude of the first surface area.

13. The method of claim 11, wherein the first and second surface areas define planes which are generally parallel.

14. The method of claim 11, wherein the first surface area defines a width dimension in a direction and the second surface area defines a width dimension in the same direction which is less than the width dimension of the first surface area.

15. A method of forming a flip chip bump comprising:
forming a bump comprising conductive material over a substrate;
dipping at least a portion of the bump into a conductive flowable material, at least some of the conductive flowable material remaining over the bump;
while the remaining flowable material over the bump is in a generally flowable state, engaging the flowable material with a generally planar surface;
exposing the bump to conditions which are effective to render the flowable material into a generally non-flowable state; and
separating the substrate and the generally planar surface.

16. The method of claim 15, wherein the separating of the substrate and the generally planar surface takes place after the flowable material is rendered into the generally non-flowable state.

17. The method of claim 15, wherein at least some of the exposing of the bump takes place during said engaging.

18. The method of claim 15, wherein:
the bump defines a first surface area which engages the substrate; and
the separating of the substrate and the generally planar surface defines a generally planar second surface area joined with the bump away from and over the first surface area, the first and second surface areas having magnitudes which are different.

19. The method of claim 18, wherein the magnitude of the second surface area is less than the magnitude of the first surface area.

20. The method of claim 18, wherein the first and second surface areas define planes which are generally parallel.

21. A method of forming a series of flip chip bumps comprising:
forming a series of bumps comprising conductive material over a substrate;
with an entirety of the bumps being outwardly exposed, dipping at least portions of the exposed bumps into a volume of conductive flowable material, at least some of the flowable material remaining over the bumps; and
solidifying the flowable material remaining over the bumps, the solidified conductive material having outermost surfaces the entireties of which are outwardly exposed over the respective bumps.

22. The method of claim 21 further comprising after solidifying the flowable material, dipping at least portions of the outermost surfaces into a volume of conductive flowable material, at least some of said flowable material remaining over the outermost surfaces.

23. The method of claim 22 further comprising after dipping the outermost surface portions into the conductive flowable material, solidifying said flowable material remaining over the outermost surfaces, said solidified flowable material remaining over individual outermost surfaces and having respective outermost surfaces the entireties of which are outwardly exposed.

24. The method of claim 21, wherein:
the bumps define respective bump heights over the substrate;
the volume of conductive flowable material is provided over a surface and to a desired thickness relative thereto; and
the dipping of the bump portions comprises dipping said portions into the conductive flowable material a distance which is less than the bump heights.

25. The method of claim 24, wherein said distance is sufficient to engage at least some of the bumps with the surface over which the conductive flowable material is provided.

26. The method of claim 21, wherein:
the bumps comprise respective base portions having outer surfaces proximate the substrate, the base portion outer surfaces defining respective width dimensions; and
the flowable material remaining over the bumps is not disposed over at least some of the base portion outer surfaces.

27. The method of claim 26, wherein the solidifying of the flowable material defines respective bump assemblies having width dimensions which are essentially no greater than individual width dimensions of respective associated bumps.

28. A method of forming a series of flip chip bumps comprising:

forming a series of bumps of conductive material over a substrate;

dipping at least portions of the bumps into a conductive flowable material, at least some of the conductive flowable material remaining over the bumps;

while the remaining flowable material over the bumps is in a generally flowable state, engaging the flowable material with a generally planar surface;

exposing the bumps to conditions which are effective to render the flowable material into a generally non-flowable state; and after the exposing, separating the substrate and the generally planar surface.

29. The method of claim 28, wherein the bumps have respective base portions which define base dimensions, and respective uppermost surface portions which define height dimensions, and the engaging and exposing increases the respective height dimensions of the bumps without increasing the respective base dimensions.

30. The method of claim 29, wherein the increased height dimensions define substantially uniform bump heights over the substrate.

31. The method of claim 28, wherein:

the bumps define respective first surface areas which engage the substrate; and the separating of the substrate and the generally planar surface defines generally planar second surface areas which are joined with the respective bumps away from and over the respective first surface areas, magnitudes of the first and second surface areas being different.

32. The method of claim 31, wherein magnitudes of the second surface areas are less than magnitudes of associated first surface areas over which the second surface areas are joined.

33. The method of claim 31, wherein the first and second surface areas define respective planes at least some of which being parallel with one another.

34. A method of interconnecting a pair of substrates comprising:

forming a bump of conductive material over a substrate;

with an entirety of the bump being outwardly exposed, dipping at least a portion of the exposed bump into a volume of conductive flowable material, at least some of the flowable material remaining over the bump;

solidifying the conductive flowable material remaining over the bump, the solidified conductive material having an outermost surface the entirety of which is outwardly exposed; and after solidifying the conductive material, conductively bonding the substrate with a second substrate through the solidified conductive material.

35. The method of claim 34 further comprising:

after solidifying the conductive material, dipping at least a portion of the outermost surface into a volume of conductive flowable material, at least some of said flowable material remaining over the outermost surface; and after dipping the outermost surface portion into the conductive flowable material, solidifying said flowable material remaining over the outermost surface, said solidified flowable material remaining over the outermost surface itself having an outermost surface the entirety of which is outwardly exposed.

36. The method of claim 34, further comprising:

after solidifying the conductive material, dipping at least a portion of the outermost surface into a volume of conductive flowable material; and said conductively bonding comprising engaging said substrate with said second substrate while at least some conductive flowable material remains in a flowable state.

37. The method of claim 34, wherein the bump comprises a base portion defining a width dimension proximate the substrate and an uppermost surface portion defining a bump height, and the solidifying of the flowable material defines a height which is greater than the height defined by the uppermost surface portion without increasing the width dimension defined by the base portion.

38. A method of interconnecting a pair of substrates comprising:

forming a bump of material over a first substrate;

immersing at least a portion of the bump in a flowable epoxy;

removing the bump from the flowable epoxy;

substantially curing flowable epoxy over the bump and forming a bump assembly; and after substantially curing, bonding the bump assembly with a second substrate.

39. The method of claim 38, wherein:

the bump defines a bump height over the first substrate; and the bump assembly defines a bump assembly height over the first substrate, the bump assembly height being greater than the bump height.

40. The method of claim 38 further comprising prior to the bonding, immersing at least a portion of the bump assembly in the flowable epoxy and substantially curing the flowable epoxy over the bump assembly.

41. The method of claim 38, wherein the curing defines a generally planar bump assembly surface outwardly of the first substrate.

42. The method of claim 41, wherein the curing comprises curing the epoxy against a generally planar surface.

43. The method of claim 38, wherein prior to the bonding the bump assembly has an outer surface which comprises at least a portion of the material of the bump.

44. A method of interconnecting a pair of substrates comprising:

forming a bump of conductive material over a first substrate, the bump having a bump height;

dipping at least a portion of the bump height into a volume of conductive flowable material, at least some of the conductive flowable material remaining over the bump;

solidifying the conductive flowable material remaining over the bump and forming a bump assembly comprising the bump and solidified conductive material, the solidified conductive material defining a bump assembly outermost surface the entirety of which is outwardly exposed, the outermost surface defining a bump assembly height which is greater than the bump height; and bonding the bump assembly with a second substrate.

45. The method of claim 44, wherein a portion of the bump assembly outermost surface comprises conductive material of bump.

46. The method of claim 45, wherein said portion of the bump assembly outermost surface comprises a base portion of the bump proximate the first substrate.

47. The method of claim 44, wherein the bump assembly outermost surface comprises a generally planar uppermost surface.

* * * * *